(12) United States Patent
Hellriegel

(10) Patent No.: US 6,310,536 B1
(45) Date of Patent: Oct. 30, 2001

(54) TERMINATION RESISTOR IN PRINTED CIRCUIT BOARD

(75) Inventor: Steven V. R. Hellriegel, Bainbridge Island, WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 09/221,186

(22) Filed: Dec. 23, 1998

(51) Int. Cl.$^7$ .................................................... H01C 1/012
(52) U.S. Cl. ........................ 338/309; 338/307; 338/312
(58) Field of Search ..................................... 338/262, 309, 338/322, 328, 308, 333, 306, 307, 311, 312

(56) References Cited

U.S. PATENT DOCUMENTS

| | | | |
|---|---|---|---|
| 3,761,860 | * 9/1973 | Ogasawara et al. | 338/262 |
| 3,786,172 | * 1/1974 | Conley | 174/68.5 |
| 4,627,565 | * 12/1986 | Lomerson | 228/107 |
| 4,771,236 | * 9/1988 | Banks | 324/158 |
| 5,347,258 | * 9/1994 | Howard et al. | 338/333 |

* cited by examiner

Primary Examiner—Lincoln Donovan
Assistant Examiner—Kyung S. Lee
(74) Attorney, Agent, or Firm—Seed Intellectual Property Law Group PLLC

(57) ABSTRACT

A printed circuit board having resistors formed therein. A conductive layer composed of two different metals is provided on top of an insulating layer in a printed circuit board. The first metal layer is highly conductive and the second metal layer is highly resistive. For a major portion of the layer, both layers are connected electrically in parallel so that they provide a highly conductive path. At selected locations throughout the printed circuit board, the highly conductive metal is removed providing only the high resistivity metal to act as a resistor between selected locations in the conductive layer. Many resistors are formed at the same time, thus providing ease of fabrication and precision in resistor values across the entire printed circuit board. Following the formation of the resistor, additional insulating and conductive layers are formed to complete the printed circuit board. An electrical connector is then formed between at least one metal layer in the printed circuit board and the resistive layer. This permits easy connection between a conductive layer which is connected to an integrated circuit to provide proper termination voltage and the termination layer, including the termination resistor.

17 Claims, 2 Drawing Sheets

TERMINATION RESISTOR IN PRINTED CIRCUIT BOARD

TECHNICAL FIELD

This invention is directed towards a resistor embedded in a printed circuit board and more particularly to a method and apparatus for forming a termination resistor in a printed circuit board.

BACKGROUND OF THE INVENTION

A number of integrated circuits require connection to a termination voltage on a printed circuit board. As shown in FIG. 1, an output driver 12 from an integrated circuit provides signals on a transmission line 10. The signals are received by an input driver 14 and provided to additional circuits. It is required in many applications to connect the transmission line 10 to a termination resistor 16 shown as $R_T$. The other end of the termination resistor is connected to a termination voltage, $V_T$, 18. In many applications, the termination voltage $V_T$ is ground. In other applications, the termination voltage may be a voltage other than ground, such as −5 volts, +2 volts or some other acceptable value.

FIG. 2 illustrates one prior art technique for providing this termination resistor. According to this technique, an integrated circuit is mounted on a printed circuit board 20. The printed circuit board 20 includes a transmission line 10 providing an input connection to the integrated circuit 22. A resistor has a first end connected to the transmission line 10 coupled to the circuit 22 and the second end connected to the termination voltage. In many applications, this is done by mounting a separate resistor on the printed circuit board and electrically connecting the resistor to a pin on the chip and mounting the chip on the printed circuit board. An array of resistors providing the desired termination resistor value are mounted on the printed circuit board and made available for such connections. This is a conventional approach and is used in many applications today. A disadvantage of this approach is the cost and effort of connecting the required individual pins from the integrated circuit board 22 to the termination resistor. In addition, additional room must be found on the printed circuit board 20 for mounting the resistors. Since resistors are exposed, they are subject to mechanical and physical damage. In the event a resistor becomes defective or a connection to the resistor is broken, often the whole board is usually discarded.

FIG. 3 illustrates a second method of providing the termination resistor according to the prior art. According to this technique, a resistor 16 is formed internal to the integrated circuit. The input line 10 is connected to the integrated circuit and directly connected to a first end of the resistor 16. The line 10 is also provided to other parts of the integrated circuit as electrically shown in FIG. 1. In addition, the other end of the resistor 16 is connected to a termination voltage via an additional pin output from the integrated circuit. The structure used in the prior art of FIG. 3 has the advantage of being more compact and more easy to manufacture because the resistor is formed as part of the integrated circuit manufacturing process. On the other hand, it has the disadvantage of requiring additional pins out to the termination voltage potential. It may cause parasitic problems on the integrated circuit along with consuming precious silicon area on the integrated circuit. In addition, forming precise resistors having large current carrying capability on an integrated circuit is difficult. Accordingly, while this technique has some advantages, it also has a number of other disadvantages which prevent it from being used in many applications.

SUMMARY OF THE INVENTION

According to principles of the present invention, termination resistors are formed in one or more layers in a printed circuit board. A conductive layer in the printed circuit board is composed of two metals, a highly conductive metal such as copper, and a less conductive metal such as nickel chromium, or other desired material to act as a resistor. The conductive layer composed of two metals is formed on top of an insulating layer.

After the conductive layer is formed on the printed circuit board, a portion of the highly conductive material is removed at a selected location so as to leave only a resistive layer of metal. A resistor is thus provided forming a series electrical path from a first portion of the highly conductive layer to a second portion of the highly conductive layer. An insulating layer is then overlaid on top of the conductive layer. Additional conductive and insulating layers are formed as part of the printed circuit board. After the printed circuit board is formed, an aperture is made through the printed circuit board. The inside of the aperture is coated with metal to connect the conductive layer to a second conductive layer in the printed circuit board. The second conductive layer is connected to a pin on an integrated circuit. One side of the conductive layer is connected to the termination voltage and the other side of the conductive layer is electrically connected to the pin of the integrated circuit for which a termination voltage is required.

The location of the resistive portion of the conductive layer that forms a resistor is positioned sufficiently far from the electrical connector to avoid mechanical stress on the resistor when the aperture is formed and also to provide thermal isolation between the resistor and the electrical connector.

The present invention has the advantage of providing at very low cost the potential for many thousands of resistors within the printed circuit board at selected locations. Further, the resistor is very easily formed and its value can be determined with precision by simple metal etching techniques. All resistors in the printed circuit board are etched in the very same step, thus providing precision of the resistor values.

DETAILED DESCRIPTION OF THE INVENTION

Figure 4:
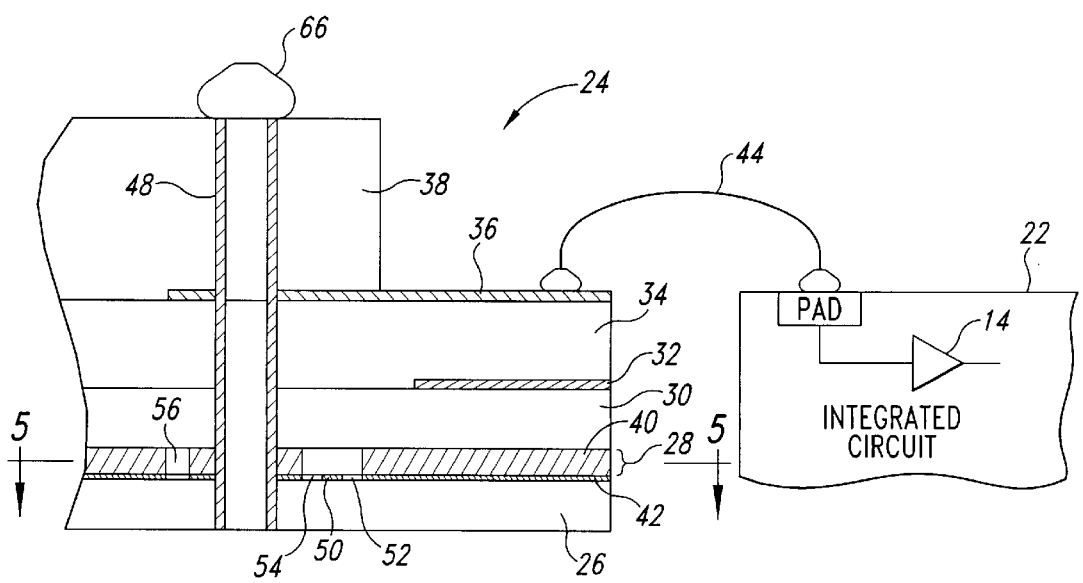
FIG. 4 is a partial cross-sectional view of the invention.

FIG. 4 illustrates a resistor formed in the printed circuit board according to principles of the present invention. The printed circuit board 24 includes many insulating and conductive layers. Printed circuit boards are generally known in the art today and are formed from layers of epoxy and fiberglass. It is generally also known in the art how to place conductive layers with metal on such printed circuit boards and etch them into desired shapes. According to principles of the present invention, the printed circuit board is formed having a resistor of a desired value and shape as will now be explained.

The printed circuit board 24 may include, for example, a first insulation layer 26, a first conductive layer 28, a second insulation layer 30, a second conductive layer 32, a third insulation layer 34, a third conductive layer 36, and a fourth insulation layer 38. Of course, a printed circuit board may include additional insulating and conductive layers and this invention only shows examples of possible layers for simplicity in illustrating the invention.

The first conductive layer 28 is formed on top of an insulation layer 26.

The layer 28 is composed of two metals, a first metal layer 40 which is highly conductive and a second metal layer 42 which is not as conductive as the first layer 40. In a preferred embodiment, the second metal layer 42 is a highly resistive layer. As examples, the first metal layer 40 may be composed of a copper alloy or other highly conductive material and the second metal layer 42 may be composed of a nickel chromium or other known metal that can act as a resistor. The thickness of the resistive layer 42 is selected to provide a desired resistance value. Preferably, the resistive layer 42 is thin, for example in the range of 1,000 Angstroms so as to provide a high resistivity to electrical current passing therethrough. The ohms per square can be selected by varying the thickness of the layer 42, its alloy composition or other factors. By such selection, resistors ranging from 100 ohms to hundreds of mega-ohms can easily be formed.

Air insulation layer 30 is formed on top of the conductive layer 20 and subsequently other conductive and insulating layers are formed. Layers 32 and 36 are conductive layers in the printed circuit board separated by insulating layers 34 and 38 from other conductive layers. The metal layer 32 may be interposed between insulation layers below the layer 36, or on the other hand may be above insulation layer 38 or in other locations throughout the printed circuit board. Layer 32 may connect to any number of components on the printed circuit board which connections are not shown for simplicity's sake. Layer 36 is electrically connected to the integrated circuit 22 via an electrical connector 44. The electrical connector 44 can be of the standard wire type or, it can be of a ball-grid array or any other acceptable connection in the art, since many suitable types of connectors 44 are acceptable for use with the present invention.

An aperture is provided through the printed circuit board having an electrical connector 48 which electrically connects the conductive layer 36 to the conductive layer 28.

Figure 1:
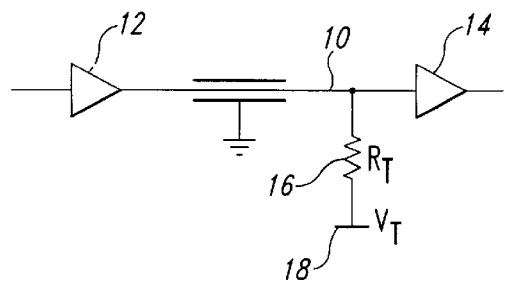
FIG. 1 is an electrical schematic of a voltage termination as is known in the prior art.
Figure 2:
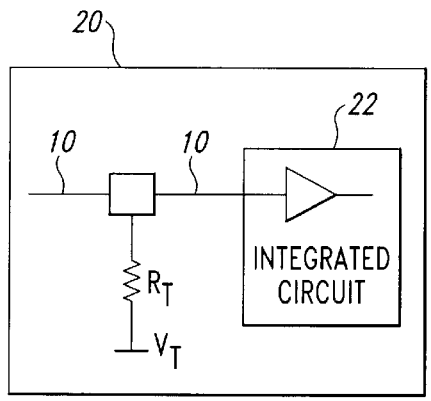
FIG. 2 is a block diagram of one prior art method for providing the voltage termination.
Figure 3:
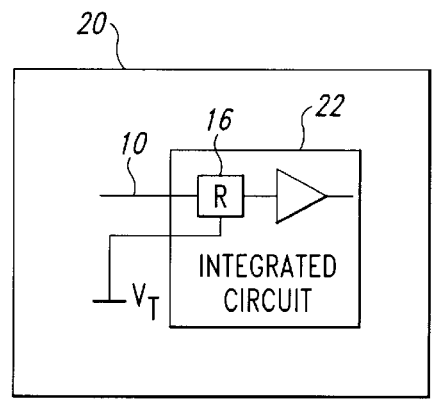
FIG. 3 is a block diagram of a second prior art method for providing the voltage termination.
Figure 5:
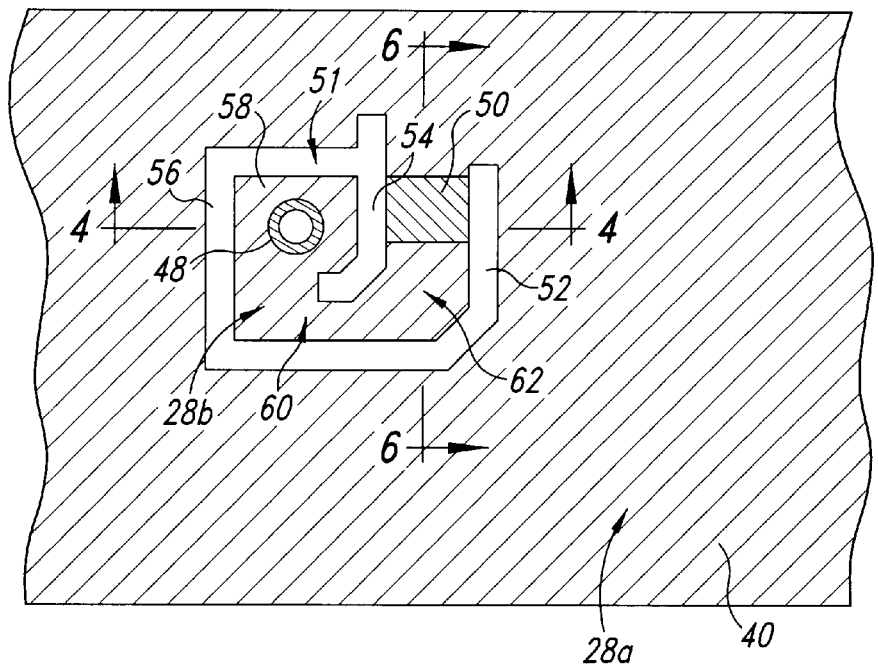
FIG. 5 is a cross-sectional view of the invention taken along lines 5—5 of FIG. 4.

FIG. 5 is a cross-sectional view taken along lines 5—5 of FIG. 4. The conductive layer 28 has a cross-sectional view taken showing highly conductive metal 40 and the resistor 50. As can also be seen in FIGS. 4, 5 and 6, the conductive metal 40 has been removed over a portion of the layer 28 leaving only the highly resistive material 50. The resistive material 50 is sized and shaped to provide a precise electrical resistance to act as the terminator resistor 16 shown in FIG. 1. An electrically isolating barrier 51 extends on both sides of resistor 50 and completely around the connector 48. The barrier 51 is preferably composed of an insulating void in which all of the first metal layer 40 has been removed from layer 28. The void may be filled with air, or any other electrically insulating material such as epoxy or the like. The barrier 51 electrically isolates a portion 28b of the highly conductive layer 28 from another portion of the highly conductive layer 28a. The electrical connector 48 is electrically connected to the conductive metal 28b providing a highly conductive path from the electrical connector 48 to a first end of the resistor 50. The resistor 50 provides a series electrical connection from the portion 28b to the large area plane 28a of conductive layer 28.

The size and relationship of the resistor and conductive void 51 can best be seen by viewing FIGS. 5 and 4. Voids 52 and 54 are on either side of the resistor 50, thus ensuring that the only electrical path from portion 28b to portion 28a is through the resistor 50. Further isolating portion 56 of the barrier 51 is on the other side of the connector 48 providing complete isolation other than through the resistor 50.

The shape of the conductive portion 28b and the barrier 51 are selected to provide high reliability and precision of the value of resistor 50. The presence, and in some instances the formation of the electrical connector 48 may create mechanical stress on immediately adjacent structures. In addition, thermal mismatching may possibly occur between the electrical connector 48 and the resistor 50. In order to reduce such mechanical and thermal interaction, the resistor 50 is spaced from the connector 48 a selected distance, yet in a compact pattern. According to a first embodiment, the distance is selected to be a certain minimum distance of the conductor 28b to ensure sufficient spacing for a thermal and mechanical isolation. Of course, in one embodiment it is possible to have the portion 28b extend in a straight line a desired distance from the connector 48. However, it is preferred, for compactness and integrity of operation to have the portion 28b circumferentially surround the connector 48 and bend around at least one corner.

As shown in FIG. 5, the conductor 28b connects at a first region to the connector 48 and then undergoes a first bend at region 60 around the isolation barrier 51. It then undergoes a second bend at region 62 and connects to a first end of resistor 50. The portion 28b is thus in a spiral around the connector 48 and although, it does not make one complete rotation around the connector 48, this could be provided if desired. By having an isolation region 54 between the barrier 48 and the resistor 50, any mechanical stress or thermal mismatching is absorbed by the layer 54 and does not affect the resistor 50. The extended path of 28b also provides more uniform current flow and reduced thermal mismatch with resistor 50 than would occur if the resistor 50 were directly connected to connector 48. Therefore, while the resistor 50 could be connected to the connector 48 in one embodiment, in the preferred embodiment it is spaced a selected distance and the conductor 28b connected to it has a desired shape including at least one turn as shown in FIG. 5.

Figure 6:
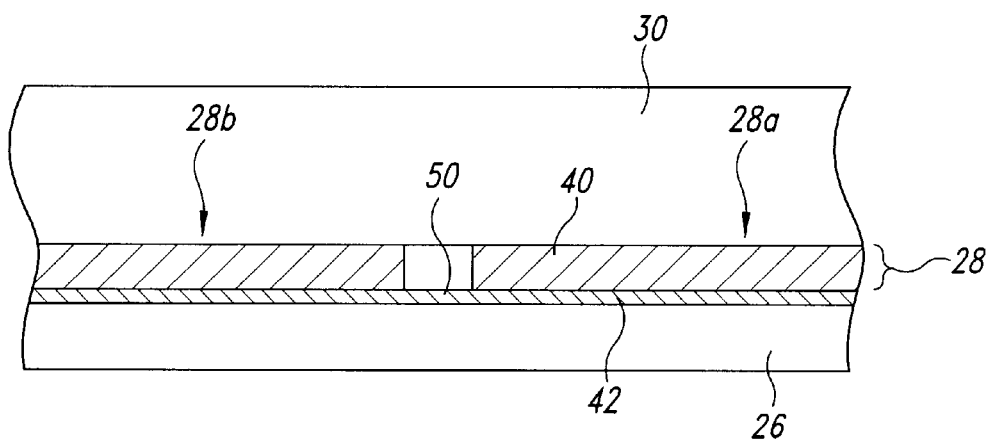
FIG. 6 is a cross-sectional view of the resistor according to the invention taken along lines 6—6 of FIG. 5.

FIG. 6 is a cross-sectional view taken along lines 6—6 of FIG. 5 also showing the portion 28a, the electrical resistor 50 and the portion 28b.

A method of making the resistor in the printed circuit board will now be described. The first insulating layer 26 is provided as part of a standard PC board. A conductor 28 is formed on the PC board, the conductor 28 being composed of two metal layers, one having a high conductivity and one having a low conductivity. In a preferred embodiment, the first layer 42 is a nickel chromium layer of approximately 1000 Angstroms and the second layer 40 is a highly conductive copper alloy which may be many thousands of Angstroms thick so as to provide a low resistivity path. The two layers are parallel to each other and extend horizontally along the plane of the printed circuit board. Where the two layers are in direct contact with each other, a very low resistance path is formed.

The copper layer 40 is then etched in the pattern as shown in FIG. 5 to create the void 51 and reveal the resistor 50. The etch is performed in a material which is selective to etch the first metal 40 and not etch the second metal 42. The pattern 51 is then etched in the second metal 42, providing a complete void and electrical isolation between the conductive portion 28b surrounding the connector 48 and the portion 28a.

In an alternative etch method, the barrier 51 is first etched completely through the conductive layer 28. An etch technique is used which etches both metal layers. The complete void 51 is therefore formed encircling the connector 48 having a pattern shape as shown in FIG. 5. After this, the highly conductive metal 40 is removed from the selected region using a selective etch to leave the resistive layer 50 in the location as shown in FIG. 5. Of course, other techniques can be used and the steps can be reversed in order to achieve the desired end structure as shown in FIG. 5, such etching techniques and other equivalents being known in the art.

Following the formation of resistive layer 50, an additional insulating layer 30 is laid on top of the conductive layer 28. Providing this insulating layer normally involves an epoxy and fiberglass application step. During such application, it may be desired to fill the void 51 with epoxy, fiberglass or some other inert material. Alternatively, it can be left as a void, each technique being acceptable that provides an electrical isolation barrier 51. After layer 38 is formed, one or more layers 32 of conductors and additional layers 34 of insulators may be provided, as many as needed for the particular application. The conductive layer 36 is also provided and provision made for electrical connection to the integrated circuit.

The forming of alternating conductive and insulating layers continues until the printed circuit board is completed. After the completion of the printed circuit board, a hole is formed in the final printed circuit board by any acceptable technique, including drilling, etching or the like. Because the formation of the aperture in the PC board may create mechanical stresses in adjacent structures, having the resistor 50 spaced from the aperture reduces the mechanical stress placed on the resistor 50. After the aperture is formed, the inner wall is coated with copper, or other highly conductive metal. This provides a solid electrical connection from layer 36 through to the layer 28. A conductive ball 66 or other electrical connection can thereafter be made to the conductor 48 if desired, though this may not be used in some embodiments.

While various shapes have been shown and described with respect to the barrier 51 and resistor 50, it will be understood that numerous different shapes or designs could also be used within the concepts of the present invention. The shape of the isolation barrier 51 may be in a ring as shown, or other acceptable shape to provide sufficient isolation of the portion 28b from the portion 28a.

The portion 28a provides a very large plane that provides a solid termination voltage. The layer 28 may include many resistors, in some instances in excess of thousands for providing the needed termination resistors to the circuit. The portion 28b is electrically connected to a termination voltage. In one embodiment, the termination voltage is −2 volts though, other values such as ground, +2 volts or the like may be used. The large plane 28a provides a high current path of high conductivity to pass large amounts of current as needed through the termination resistors which may be connected to the PC board. It thus provides, a quick and easy method of providing many thousands of resistors which may all be formed simultaneously in the same etching steps, each resistor being formed to a precise size and shape as desired for the resistance value of each application.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A resistor in a printed circuitboard comprising:
   a stacked conductive layer extending horizontally within the printed circuit board, the conductive layer being composed of two conductive layers, the first conductive layer having a higher conductivity than the second conductive layer;
   a first portion of the stacked conductive layer having the first and second conductive layers connected electrically in parallel to each other;
   a second portion of the stacked conductive layer having the first and second conductive layers connected electrically in parallel to each other;
   a third portion of the stacked conductive layer between the first and second portions, the third portion being composed solely of the second conductive layer having a lower conductivity than the first conductive layer and having the first and second conductive layers connected electrically in series with each other to form a resistor by a series electrical path from the first portion of the stacked conductive layer, through the resistor and then to the second portion at the stacked conductive layer;
   an insulating layer above the conductive layer;
   an insulating layer below the conductive layer, thus electrically isolating the conductive layer within the printed circuit board;
   an electrical connector coupling the second portion of the stacked conductive layer to an integrated circuit mounted on the printed circuit board; and
   the cross sectional shape of the second portion providing an isolation barrier on a straight line distance between the electrical connector and the resistor such that a second conductive region turns at least one corner between the electrical connector and the resistor.

2. A resistor in a printed circuit board comprising:
   a stacked conductive layer extending horizontally within the printed circuit board, the conductive layer being composed of two conductive layers, the first conductive layer being more conductive than the second conductive layer;
   a first portion of the stacked conductive layer having the first and second conductive layers connected electrically in parallel to each other;
   a second portion of the stacked conductive layer coupled to the first portion, the second portion being composed solely of the second conductive layer and having the first and second conductive layer layers connected electrically in series with each other to form a resistor by a series electrical path from the first conductive layer, through the second conductive layer and then to the first conductive layer;
   a third portion of the stacked conductive layer having the first and second conductive layers connected electrically in parallel to each other, the third portion coupled to the first portion through the second portion, wherein the size and shape of the third portion of the conductive layer selected to space the resistor a selected mechanical and thermal distance from an electrical connection point, and the cross sectional shape of the third portion provides an electrical isolation barrier on a straight line distance between the electrical connection point and the resistor such that the second conductive layer turns at least one corner between the electrical connection point and the resistor;

an insulating layer above the stacked conductive layer;

an insulating layer below the stacked conductive layer and electrically isolating the stacked conductive layer within the printed circuit board;

an electrical connector coupled to the electrical connection point and coupling the third portion of the layer to an integrated circuit mounted on the printed circuit board; and an electrical connection coupling the first portion of the conducive layer to a selected voltage potential such that current passes in series from the integrated circuit, through the electrical connector, through the first portion of the conductive layer, through the resistor and through the third portion of the conductive layer to the selected voltage potential.

3. A printed circuit board comprising:

a first conductive layer;

a first insulating layer adjacent to the first conductive layer;

a second conductive layer separated from the first conductive layer by at least the first insulating layer, the second conductive layer being electrically connected to a selected voltage potential;

a first portion of the second conductive layer isolated from a second portion of the second conductive layer and having a cross-sectional shape that spaces a connection region of the first portion away from the second portion and provides an electrical isolation barrier on a straight line distance between the connection region of the first portion and the second portion such that the first portion turns at least one corner between the connection region and the second portion;

a resistive portion coupled between the first and second portions of the second conductive layer and being composed of a material having lower conductivity than the second conductive layer;

an electrical connector coupling the first conductive layer to the connection region of the second conductive layer providing a series electrical path from the first conductive layer, through the resistor, such that the resistor and first and second conductive layers, the electrical connection and the insulating layer are all within the printed circuit board.

4. A printed circuit board comprising:

a first conductive layer;

a first insulating layer adjacent to the first conductive layer;

a second conductive layer separated from the first conductive layer by at least the first insulating layer, the second conductive layer being electrically connected to a selected voltage potential;

a resistor formed of a third conductive layer having a lower conductivity than the second conductive layer;

an isolated portion of the second conductive layer coupled to another portion of the second conductive layer by the resistor, the isolated portion having a cross-sectional shape that spaces a connection region of the isolated portion away from the other portion of the second conductive layer and provides an electrical isolation barrier on a straight line distance between the connection region of the isolated portion and the resistor, whereby the isolated portion includes one bend between the connection region and the resistor; and an electrical connector coupling the first conductive layer to the connection region of the second conductive layer providing a series electrical path from the first conductive layer, through the resistor such that the resistor and first and second conductive layers, the electrical connection and the insulating layer are all within the printed circuit board.

5. The printed circuit board of claim 4, wherein the selected voltage potential is ground.

6. The printed circuit board of claim 4, wherein the selected voltage potential is a termination voltage that is different from ground.

7. The printed circuit board according to claim 4, wherein the first and second conductive layers are parallel to each other, extending parallel to a major face of the printed circuit board and the electrical connector is perpendicular to the two conductive layers, extending through the printed circuit board.

8. The printed circuit board of claim 7, wherein the second conductive layer and the resistor comprise different metals, a first metal forming the second conductive layer being more conductive than a second metal forming the resistor.

9. The printed circuit board of claim 8, wherein the resistor is formed of the second metal having a selected width and length which result in predetermined resistance and current dissipation values.

10. The printed circuit board of claim 9, wherein the electrical connector is coupled to one end of the resistor via an isolated portion of the second conductive layer.

11. The printed circuit board of claim 10, wherein the isolated portion is formed with a size and shape selected to provide mechanical and thermal isolation between the electrical connector and the end of the resistor.

12. A printed circuit board comprising:

a first conductive layer;

a first insulating layer adjacent to the first conductive layer;

a second conductive layer separated from the first conductive layer by at least the first insulating layer, the second conductive layer being electrically connected to a selected voltage potential;

a resistor formed of a third conductive layer having a lower conductivity than the second conductive layer;

an isolated portion of the second conductive layer coupled to another portion of the second conductive layer by the resistor, the isolated portion having a cross-sectional shape that spaces a connection region thereof away from the resistor such that the isolated portion turns at least one corner between the connection region and the resistor;

an electrical connector coupling the first conductive layer to the connection region of the second conductive layer providing a series electrical path from the first conductive layer, through the resistor such that the resistor and first and stacked conductive layers, the electrical connection and the insulating layer are all within the printed circuit board.

13. The resistor according to claim 12, wherein the isolated portion turns two corners between the connection region and the resistor.

14. A first electrically insulating substraight layer:

a first electrically insulating layer;

a first electrically conductive layer positioned on top of the first electrically insulating layer;

a second electrically conductive layer, positioned below the first electrically insulating layer;

an electrically conductive terminal extending between the first conductive layer and the second conductive layer;

a first portion of the second electrically conductive layer positioned adjacent to, and in contact with, the electrically conductive terminal;

a resistor having a first portion electrically connected to the first portion of the second conductive layer;

an electrical isolation barrier extending between the first portion of the second conductive layer and the resistor so as to provide an electrical isolation barrier in a direct line, shortest distance path, between the electrically conductive terminal and the resistor, the electrical isolation barrier being positioned such that the first portion of the second conductive layer encounters at least one turn between the electrically conductive terminal and the resistor;

a second portion of the second conductive layer, electrically connected to a second portion of the resistor; and an electrical connection to the second portion of the second conductive layer.

15. The claim according to claim 14, further including a second electrically insulating layer positioned between the first conductive layer and the second conductive layer.

16. The structure according to claim 14, wherein the first portion of the second conductive layer encounters at least two turns between the electrically conductive terminal and the resistor.

17. The structure according to claim 14, wherein the second electrically conductive layer and the resistor are formed of a stacked electrically conductive layer composed of a highly conductive material and a generally resistive material, the highly conductive material being etched away at those portions where the resistor is formed, and both the highly conductive material and the resistive material being etched away at those portions where the electrical isolation barrier is formed.

* * * * *